US 008476088B2

(12) United States Patent
Lee et al.

(10) Patent No.: US 8,476,088 B2
(45) Date of Patent: Jul. 2, 2013

(54) LIGHT EMITTING DIODE HAVING IMPROVED LIGHT EMISSION EFFICIENCY AND METHOD FOR FABRICATING THE SAME

(75) Inventors: In Hwan Lee, Jeonbuk (KR); Lee Woon Jang, Jeonbuk (KR); Jin Woo Ju, Jeonbuk (KR); Jung Hun Choi, Jeonbuk (KR); Jae Woo Park, Chungnam (KR)

(73) Assignee: Industrial Cooperation Foundation Chonbuk National University, Chonbuk (KR)

( * ) Notice: Subject to any disclaimer, the term of this patent is extended or adjusted under 35 U.S.C. 154(b) by 0 days.

(21) Appl. No.: 12/911,070

(22) Filed: Oct. 25, 2010

(65) Prior Publication Data

US 2011/0186863 A1    Aug. 4, 2011

(30) Foreign Application Priority Data

Feb. 2, 2010    (KR) .................. 10-2010-0009468

(51) Int. Cl.
*H01L 33/00*    (2010.01)
(52) U.S. Cl.
USPC .............. 438/22; 438/34; 257/E33.001
(58) Field of Classification Search
USPC .................................... 438/22, 34
See application file for complete search history.

(56) References Cited

U.S. PATENT DOCUMENTS

| 7,655,566 | B2 * | 2/2010 | Fujii ........................ 438/678 |
| 7,675,084 | B2 | 3/2010 | Wierer |
| 2003/0179974 | A1 * | 9/2003 | Estes et al. .................... 385/2 |
| 2007/0026580 | A1 * | 2/2007 | Fujii ........................ 438/149 |
| 2008/0290434 | A1 * | 11/2008 | Chen et al. ................. 257/431 |
| 2010/0117118 | A1 * | 5/2010 | Dabiran et al. ............. 257/190 |
| 2010/0213485 | A1 * | 8/2010 | McKenzie et al. ............. 257/98 |
| 2010/0304570 | A1 * | 12/2010 | Horie et al. ................. 438/710 |

FOREIGN PATENT DOCUMENTS

| KR | 1020070005717 | 7/2008 |
| KR | 1020070013664 | 8/2008 |

OTHER PUBLICATIONS

English Abstract of Korean Patent Application No. 1020070013664, Aug. 13, 2008.
English Abstract of Korean Patent Application No. 1020070005717, Jul. 23, 2008.

* cited by examiner

*Primary Examiner* — Alexander Ghyka
(74) *Attorney, Agent, or Firm* — McClure, Qualey & Rodack, LLP (57) ABSTRACT

Provided is a light emitting diode (LED) having improved light emission efficiency, which can effectively overcome a technical limit of the related art by implementing a surface plasma resonance effect as well as reducing a layer defect such as threading dislocations in an LED structure.

10 Claims, 10 Drawing Sheets

LIGHT EMITTING DIODE HAVING IMPROVED LIGHT EMISSION EFFICIENCY AND METHOD FOR FABRICATING THE SAME

CROSS-REFERENCE TO RELATED APPLICATION

This application claims priority to and the benefit of Korean Patent Application No. 10-2010-0009468 filed on Feb. 2, 2010 in the Korean Intellectual Property Office, the entire contents of which are incorporated herein by reference.

BACKGROUND OF THE INVENTION

1. Field of the Invention

The present invention relates to a light emitting diode capable of implementing high light emission efficiency by using a surface plasmon phenomenon as well as showing reduced crystal defects (i.e., threading dislocations) and a method for fabricating the same.

2. Description of the Related Art

Figure 1:
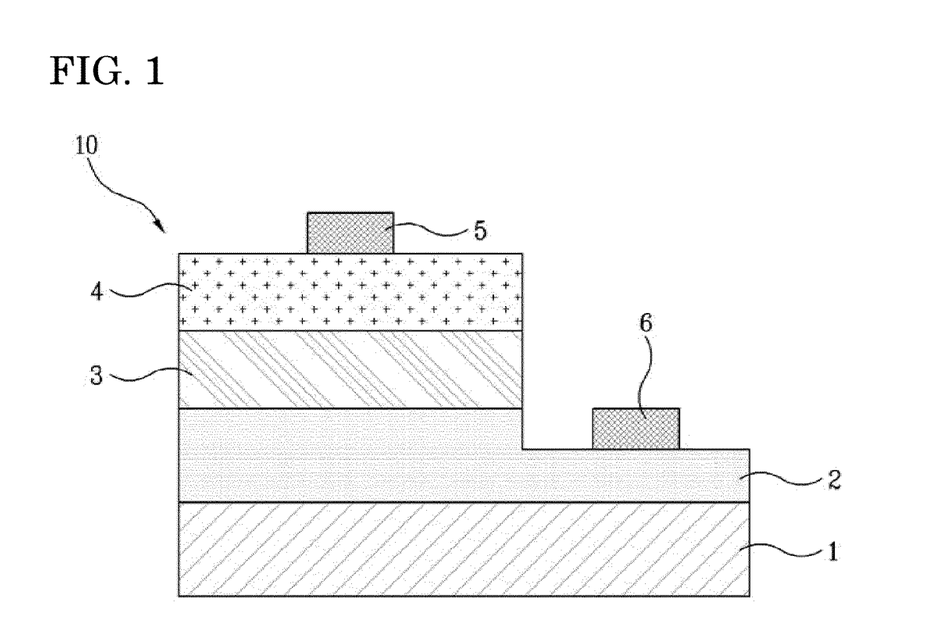
FIG. 1 is a cross-sectional view schematically showing a layer structure of a general planar LED.

FIG. 1 is a cross-sectional view schematically showing a layer structure of a general planar LED 10. In the figure, the LED is constituted by a substrate 1, an n-type semiconductor layer 2, an active layer 3, and a p-type semiconductor layer 4 sequentially formed from the bottom. A p-electrode 5 is formed on the top of the p-type semiconductor layer 4, while an n-electrode 6 is formed on an exposure surface of the n-type semiconductor layer 2. However, in thin-film growth for fabricating a representative GaN-based LED, the lack of materials matched with lattice constants is pointed out as one of the main problems. For this reason, a homoepitaxially grown GaN thin film has problems such as high-density defects (i.e., threading dislocations, other point defects, and the like) caused due to the mismatch in lattices and thermal expansion coefficients between a GaN film and homogeneous substrates. Up to now, since c-surface sapphire has been widely used as the substrate because it can be inexpensive and form comparatively high-quality epitaxial layer in spite of its lattice mismatch (approximately 16%).

A technology of forming a buffer layer or a shock-absorbing layer on a substrate in order to reduce the threading dislocations caused due to the mismatch is widely known, but it cannot also but generate a lot of defects. As another method, a technology such as epitaxially laterally overgrowth (ELOG) is proposed. However, overgrowth of GaN of approximately 10 μm, which is comparatively thicker is achieved in order to attach adjacent pattern regions to each other and a process cost is increased.

In relation therewith, an attempt to solve the problem of the low threading dislocations by using porous semiconductors is made. This is a technology of reducing the threading dislocations by using the porous semiconductor having a crystalline structure of an initial material as a template for homoepitaxially lateral growth of a lattice mismatch material. For example, Hartono et al. reported that a GaN layer having low defect density can be formed by using a nano-porous GaN template (Phys. Status Solidi B 244, 1793 (2007)) and that a GaN layer subsequently grown on an annealed porous GaN template shows a characteristic in that threading dislocation density was reduced by approximately 60% (Appl. Phys. Lett. 90, 171917 (2007)). Furthermore, the same researchers proposed the influence of subsequent regrowth of a GaN buffer layer on the nano-porous GaN layer at different chamber temperatures and a mechanism in which the threading dislocations in the subsequently regrown GaN film were reduced (Phys. Status Solidi C 6, No. S2, S699-S702 (2009)).

Meanwhile, in recent years, an attempt to improve internal quantum efficiency by using surface plasmon through the interaction between light and metal has been made. The surface plasmon as collective charge density oscillation which occurs on the surface of a metal thin film is a surface electromagnetic wave which is localized to a very small region which is a boundary between metal and a dielectric (air, a semiconductor, or the like), that is, an interface between both materials and progressed on the interface.

The generated surface electromagnetic wave has energy that generates resonance that varies depending on a metal type and when the generated surface electromagnetic wave is sufficiently close to an active layer which exists in an LED and the energy of the surface electromagnetic wave is matched, energy coupling occurs. In this case, energy coupling occurs in non-emission recoupling energy as well as emission recoupling energy which occurs on the active layer, such that since light is emitted by the surface plasmon, the internal quantum efficiency is increased. In general, metals such as Pd and Al are mainly used in a UV emission region and metals such as Ag, Pt, Cu, Au, and the like are mainly used in a visible ray region.

As such, recouping speed of carriers which exist in the LED is improved through the intercoupling between the surface plasmon and the active layer formed by collective oscillation of free electros which exist in metal. Therefore, an n-type GaN layer (alternately a p-type GaN layer) and an active layer (having multi-quantum well structure) are sequentially formed on the substrate and thereafter, a general metal layer is attached onto the surface of the active layer together with the p-type GaN layer (alternately, the n-type GaN layer) of a predetermined thickness (typically, approximately less than 50 nm), for the effective coupling of the active layer and the surface plasmon.

However, the related arts (Korean Patent Publication No. 2008-74474 and Korean Patent Publication No. 915502) can improve the internal quantum efficiency of the LED element through a surface plasmon resonance effect to some extent, but are still technologically limited in that the internal quantum efficiency is deteriorated due to the layer defect such as the threading dislocations.

As described above, the relates arts which are previously known merely adopt only any one of a method of using the surface plasmon and a method of reducing the defects such as the threading dislocations, and the like in order to improve the internal quantum efficiency and cannot implement both methods.

SUMMARY OF THE INVENTION

The inventors have consistently studied the solutions in order to effectively solve the problems of the related art. As a result, in the case in which porosity (preferably, nano-scale porosity) is granted to a conductive semiconductor, particularly, the top of the conductive semiconductor layer formed on a substrate, a metal layer is formed in the porous region and thereafter, discontinuously patterned by annealing, and the conductive semiconductor layer is regrown, the defect density of a regrowth layer is remarkably reduced and in addition, in the case in which the thickness of the regrown conductive semiconductor layer is appropriately adjusted, a surface Plasmon resonance effect by the metal layer is acquired, as a result, internal quantum efficiency can also be improved.

Furthermore, it is possible to overcome the limit of the related art to limit the thickness of the conductive semiconductor layer (particularly, the p-type semiconductor layer) positioned on the top of an active layer to a very low level in order to acquire an effect of the improvement of light emission efficiency by surface plasmon.

Further, the inventors verifies that the metal layer formed on the bottom of the active layer can acquire the surface plasmon resonance effect and acquire even additional light emission efficiency improvement effect by a reflection function by disposing the metal layer on the bottom of the active layer.

Accordingly, the present invention has been made in an effort to provide an LED and a method for fabricating the same which can achieve both an increase in internal quantum efficiency depending on a decrease in layer defects and the improvement of the internal quantum efficiency by surface plasmon.

An exemplary embodiment of the present invention provides a method for fabricating a light emitting diode that includes: a) providing a first conductive semiconductor layer; b) forming a porous region by dry or wet etching the top of the first conductive semiconductor layer; c) forming a metal layer on the first conductive semiconductor layer where the porous region is formed; d) regrowing the first conductive semiconductor layer on the metal layer; e) forming an active layer on the regrown first conductive semiconductor layer; and f) forming a second conductive semiconductor layer on the active layer, wherein at step d), the first conductive semiconductor layer is regrown while the metal layer is discontinuously patterned in the porous region by annealing and the regrown first conductive semiconductor layer has a thickness to generate surface plasma resonance between the patterned metal layer and the active layer.

According to the exemplary embodiments of the present invention, a light emitting diode (LED) and a method for fabricating the same can effectively overcome a technical limit in improving the internal quantum efficiency of the related art by implementing surface plasmon resonance as well as reducing a layer defect in an LED structure and furthermore, acquire an additional reflection or scattering effect using a metal layer, thereby improving overall light emission efficiency. Further, far-reaching commercialization is expected afterwards.

DETAILED DESCRIPTION OF THE EMBODIMENTS

In the specification, each of "a first conductive semiconductor" and "a second conducive semiconductor" means "an n-type" or "a p-type" and have opposite conductive characteristics to each other. Therefore, in the case in which the first conductive semiconductor is an n-type semiconductor, the second conductive semiconductor corresponds to a p-type semiconductor and vice versa. More typically, the first conductive semiconductor is the n-type semiconductor and the second conductive semiconductor is the p-type semiconductor.

In the specification, "a metal layer" means a case in which metal is formed in a lower base layer in the form of continuous layers while having a predetermined thickness and in addition, may means a case in which metal is formed on the lower base layer in a discontinuous pattern, for example, regularly or irregularly distributed dots, an island where the dots are connected to each other, or a pattern where they coexist. The accurate meaning of the metal layer will be appreciated as a meaning suitable for a detailed context to be described below.

Figure 2:
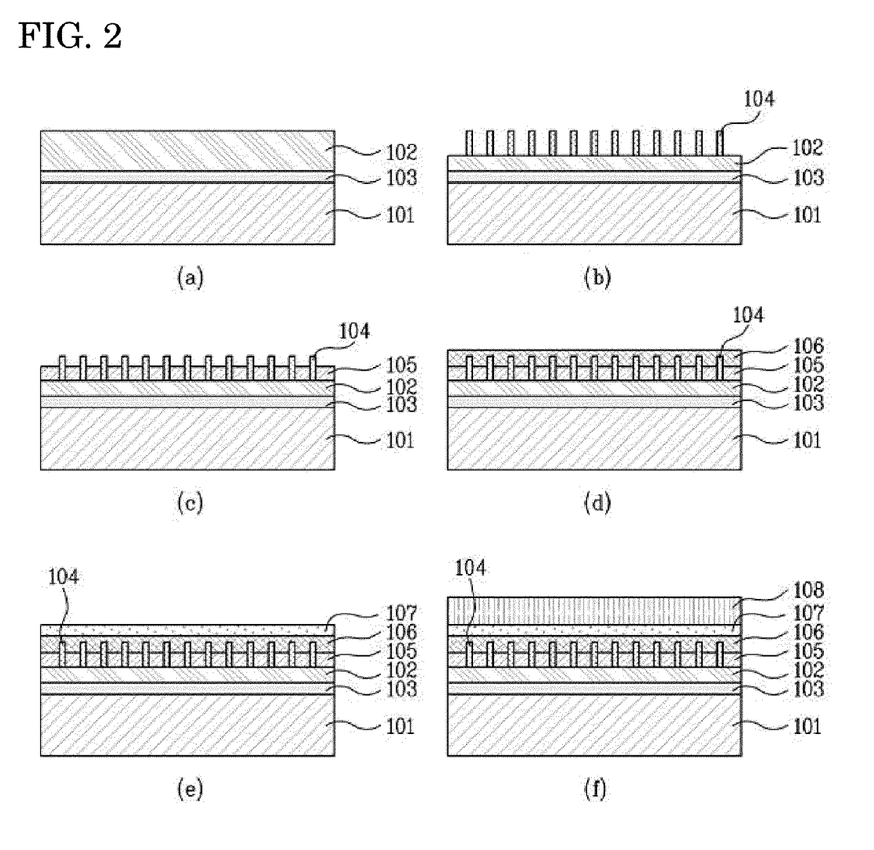
FIG. 2 is a diagram sequentially showing a process of fabricating a nano rod LED according to an exemplary embodiment of the present invention.

FIG. 2 is a diagram sequentially showing an LED fabricating process according to an exemplary embodiment of the present invention.

First, as shown in FIG. 2A, a first conductive semiconductor layer 102 is formed on a substrate 101 from the bottom. In this case, a buffer layer 103 may selectively be formed between the substrate 101 and the first conductive semiconductor layer 102 in order to alleviate the lattice constant mismatch between the substrate 101 and the first conductive semiconductor layer 102 and induce 2D growth. That is, in the case in which the semiconductor layer is grown on the buffer layer 103, interface energy is reduced as compared with a case in which the semiconductor layer is directly grown on a heterogeneous substrate. Therefore, a core is generated with high density and in addition, planar growth is promoted by the promotion of lateral growth, thereby alleviating lattice mismatch to some extent.

The substrate 101 as a substrate known as a substrate for fabricating the LED in the art, typically, a substrate for growing a semiconductor single crystal may be selected from, for example, substrates made of sapphire, silicon carbide (SiC), gallium arsenide (GaAs), gallium nitride (GaN), $MgAl_2O_4MgO$, $LiAlO_2$, $LiGaO_2$, and the like and more typically, the sapphire substrate may be used. For example, when the first conductive semiconductor layer and the buffer layer are GaN based, homoepitaxy is made in the case in which the substrate is made of a GaN-based material, while heteroepitaxy is made in the case in which the substrate is made of sapphire.

The first conductive semiconductor, and an active layer and a second conductive semiconductor to be described below may be made of diversified semiconductor materials (III-V, II-VI, and the like) known as materials for fabricating the LED in the art, i.e., GaN, AN, InP, InS, GaAs, CdS, CdSe, CdTe, ZnS, ZnSe, ZnTe, ZnO, $Al_xGa_{1-x}N$, $In_xGa_{1-x}N$, $In_xGa_{1-x}As$, $Zn_xCd_{1-x}S$, and the like without a particular limit and made singly or through the combination thereof (in the above, $0<x<1$).

The first conductive semiconductor layer 102 may have a thickness in the range of approximately 1 to 30 μm, more preferably, in the range of approximately 1 to 5 μm. Further, the thickness of the shock absorbing layer or the buffer layer 103 which is selectively formable may be approximately 300 nm or less in the case of low-temperature (LT) GaN and approximately 4 μm or less in the case in which super-lattice or an additional interlayer is inserted in addition to LT GaN.

As the next step, as shown in FIG. 2B, a porous region (alternately a surface) is formed on the top of the first conductive semiconductor layer 102. According to the exemplary embodiment of the present invention, the porous region may be formed by etching processing, specifically, dry or wet etching processing.

In relation therewith, photo-electrochemical etching (PEC) may preferably be used as the wet etching processing. The wet etching processing is performed by the unit of several to tens nms and the wet etching processing is advantageous to have a uniform form throughout a predetermined region. Hereinafter, the most preferable PEC etching will primarily be described among preferable wet etching methods to form nano-porosity.

First, resistive contact is formed in an etching object (alternately, a sample) and two electrodes are connected to each other by using a platinum (Pt) electrode as an opposite electrode and thereafter, for example, a chemical battery is configured in diluted potassium hydroxide (KOH) and etching is induced by irradiating light such as ultraviolet rays. In this case, ammonia, hydrochloric acid, phosphoric acid, and the like may be used as an etching solution in addition to KOH.

Figure 3:
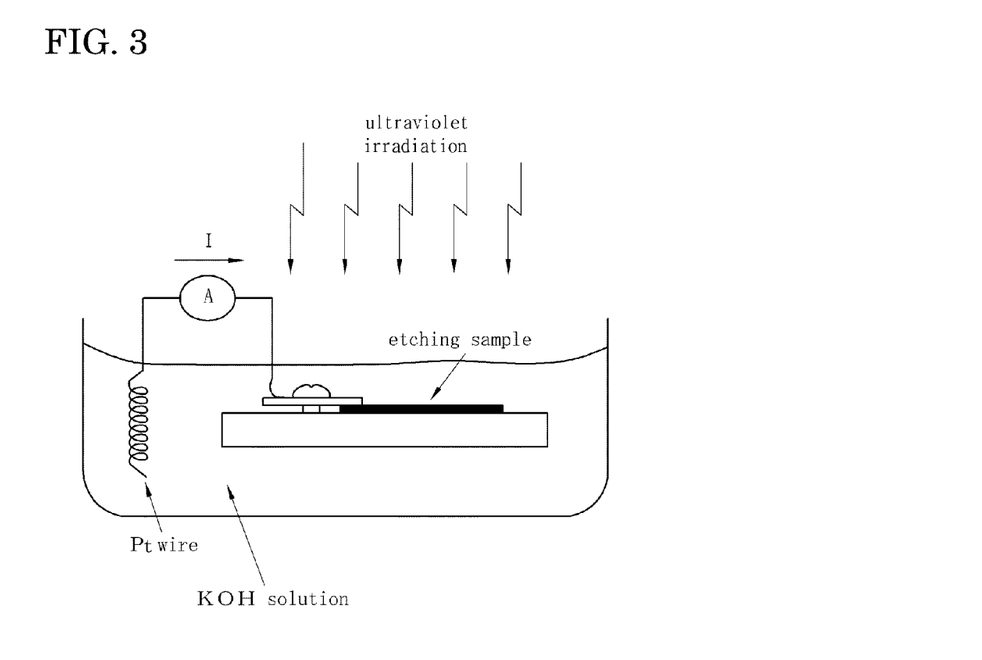
FIG. 3 is a diagram showing a schematic configuration of a usable PEC etching device according to an exemplary embodiment of the present invention.

FIG. 3 is a diagram showing a schematic configuration of a usable PEC etching device according to an exemplary embodiment of the present invention. Referring to the figure, a principle to PEC-etching a GaN-based sample will schematically be described.

When ultraviolet rays are irradiated to a GaN surface, holes are generated and moves to the surface. In this case, an OFF radical in an electrolyte reacts with GaN to be converted to $Ga_2O_3$. An electron-hole pair is generated by a photon supplied from a source having energy equal to or higher than band-gap energy ($E_g$) of a semiconductor and photoproduced holes promote an oxidation reaction on the surface of the semiconductor, while excessive electrons are consumed by a reduction reaction on an opposite electrode. In a series of reactions accompanied by the PEC etching, a KOH electrolyte serves as a catalyst and serves to dissolve the generated $Ga_2O_3$. As such, a GaN semiconductor is wet-etched through an oxidation/reduction process in the electrolyte and surplus holes are supplied by irradiating ultraviolet rays to promote the oxidation reaction, thereby increasing etching speed.

According to the above method, porosity is shown by etching the top surface of the first conductive semiconductor 102. Specifically, the oxidation speed of the first conducive semiconductor primarily depends on the supply speed of the photoproduced holes. Further, typically applied voltage and irradiation of ultraviolet rays are constantly maintained during the etching. Therefore, different etching speeds are generated depending on the concentration of holes distributed on the surface of the first conductive semiconductor layer to influence the morphology of the surface. In this case, since a defect such as threading dislocations functions as a trap of a photoproduced carrier, etching speed is reduced. Accordingly, a porous characteristic is shown due to a deviation of the etching speed (that is, nonuniform etching). Further, a region where electrical potential exists serves as the trap not to be oxidized and etching of the region is suppressed by the electrolyte such as KOH, such that the region may exist in the form of a rod.

In the shown PEC etching device, under the irradiation of an ultraviolet light source, (+) voltage is applied to the etching object or sample through a copper wire, and the like, while (−) voltage may be applied to the platinum electrode or wire. In this case, the voltage is typically in the range of approximately 0.1 to 15V and the concentration of the electrolyte (i.e., KOH) may be typically at least approximately 0.001 M and in some cases, the electrolyte may be used in a dissolved state (i.e., dissolved KOH).

An etching time depends on the area of the etching object or the sample. The smaller the area is, the less the etching time is. Therefore, it is possible to appropriately set the etching time by considering porosity of a desired degree. For example, a sample having a size of approximately 10×10 mm may be PEC-etched with the KOH concentration of approximately 0.02 M and applied voltage of approximately 2V for approximately 20 minutes under the irradiation of a light source (i.e., a xenon lamp, a UV lamp, and the like) having a wavelength range of approximately 365 nm to excite GaN.

Further, in the case of a sample having a diameter of 2 inches by considering regrowth, i.e., MOCVD regrowth in a follow-up process, it is possible to ensure porosity while changing the etching process condition to KOH of 0.01 M, 2V, and 60 minutes or KOH of 0.04 M, 2V, and 40 minutes. Since the process condition (including the type and concentration of the electrolyte, the intensity of the light source, the applied voltage, the etching time, and the like) is described for an exemplary purpose, the present invention is not necessarily limited to the above-mentioned detailed process condition ranges.

However, in general, as the concentration of the electrolyte, the applied voltage, and the etching time increase, the etching speed also increases, while as the etching area is smaller, the etching form is more uniform. Further, as the intensity of the used light source increases, the etching speed also increases.

In the specification, "porous" may means morphology in which a plurality of spaces (pores) of which boundaries are determined by nonuniform etching of the surface are formed, particularly preferably, "nano-porous" in which the morphology is grasped as a nano-scale (i.e., a size of approximately 1000 nm or less).

As described above, as the PEC etching is in progress, the rod (a nano-sized rod or a nano rod) will be formed at a portion of the surface of the first conductive semiconductor layer 102 where the defect such as the threading dislocations exists. As a result, a porous region including a plurality of nano rods are formed on the surface of the first conductive semiconductor layer (i.e., the n-type GaN layer). In this case, when parameters of the etching process are changed (i.e., when the etching time or concentration increases to a predetermined level or more), a rod shape will gradually be lost.

The present invention is not limited by a predetermined theory, but changes which occur during the PEC etching process may be described in detail.

When etching (particularly, PEC etching) is in progress in the form of a thin film, an irregular concave-convex surface is formed and as the etching is consistently in progress, the etching is interrupted at the defective portion, such that the rod form (since this portion is a dislocation portion, it is also referred to as a whisker) remains. Even in this state, a bottom region between the rods is porous by the difference in etching speed. However, the rod form is remarkably observed by appearances. When the etching is further in progress, a rod structure comes off or is lost while the width of the rod structure gradually decreases.

As such, in the specification, both the case in which the nano rod shown in a comparatively initial stage during the etching (particularly, PEC etching) is formed and the case in which the rod structure is lost by the continuous etching may be included in the meaning of "porosity".

As the etching is continuously in progress, the rod form is gradually lost, but as described above, porosity will still be shown by the space (alternately, pore) formed by convex portions and concave portions (unevenness) of irregular patterns. In this case, an average size (alternately, an average diameter) of the pore may be in the range of approximately 30 to 50 nm.

Meanwhile, the thickness of the porous region 104 is preferably in the range of approximately 30 to 1000 nm, more preferably, in the range of approximately 50 to 300 nm. In particular, in the case in which the nano rod is formed, the width of the rod maybe preferably in the range of approximately 5 to 400 nm, more preferably, in the range of 10 to 40 nm, and the height of the rod may be preferably in the range of approximately 30 to 1000 nm, more preferably, in the range of 50 to 300 nm.

Meanwhile, the porous region 104 is more preferably configured by a plurality of nano rods. The nano rods may reduce the loss of the metal layer in the follow-up regrowth and furthermore, more effectively induces lateral growth (i.e., serving as a mask of an ELOG process) to reduce defect density as described below. Moreover, light extraction efficiency may also be improved through surface roughness by the nano rods. The advantage is acquired because even though the nano rod is lost by the etching which is in progress, the porous region 104 still has porosity characteristics, but it is further enforced by the nano rods.

In the above description, the PEC etching is primarily described, but a dimension regarding porosity, in particular, a porosity dimension including the nano rods may be adopted even in porosity formed by the dry etching processing.

After the forming of the porous region, as shown in FIG. 2C, the metal layer 105 is formed on the porous region (alternately, the surface 104). The metal layer 105 is coupled to an active layer, particularly, a quantum well of the active layer to be formed later to use metal suitable to generate surface plasmon resonance. Therefore, the metal layer 105 may preferably adopt palladium (Pd), aluminum (Al), silver (Ag), Platinum (Pt), copper (Cu), gold (Au), chrome (Cr), or combinations thereof. Further, in some cases, the metal layer 105 may be configured by a plurality of layers using different metals. According to the exemplary embodiment of the present invention, the thickness of the metal layer may typically be determined in the range of approximately 1 to 1000 nm, more typically, in the range of approximately 5 to 250 nm. Therefore, the thickness of the metal layer may be smaller than the thickness of the porous region 104.

The morphological feature of the metal layer formed as described above by the morphology of the porous region or of the first conductive semiconductor layer or the surface 104 positioned in the lower part, but may not accurately correspond thereto.

As shown in FIG. 2D, after the metal layer 105 is formed, an additional layer made of the same material of the first conductive semiconductor layer 102 is formed and it may be referred to as a regrowth layer 106 of the first conductive semiconductor.

As such, in order to regrow the first conductive semiconductor on the metal layer 105, a known epitaxial layer forming (growing) method, i.e., a metal organic chemical vapor deposition (MOCVD) method, a molecular beam epitaxy (MBE) method, and a hydride vapor phase epitaxy (HVPE) method may be adopted. The metal organic chemical vapor deposition (MOCVD) method is more preferable. The reason is that since the MOCVD method has higher growth efficiency than other growth methods and involves annealing (heat treatment) therein, additional annealing needs not to be performed before the regrowth.

The metal organic chemical vapor deposition method for regrowing the first conductive semiconductor involves an annealing (heat treatment) process typically in the range of approximately 600 to 1050° C., more typically in the range of approximately 800 to 1000° C. (typically, for approximately 1 to 5 minutes). During the process, the metal layer 105 that exists on the bottom is melted, such that a discontinuous pattern, i.e., regular or irregular distributed dots, an island where the dots are connected to each other, or a pattern where they coexist may be formed in the porous region 104 of the first conductive semiconductor layer 102. In particular, in the case of the porous region or the surface where the nano rods are formed, metal dots may be formed on the top of the nano rod and the metal layer may be formed on the bottom between the nano rods in the discontinuous pattern described above. As such, in the case in which the metal layer is formed in the discontinuous pattern by the annealing, the metal layer exists as a kind of cluster. Therefore, the thickness of the discontinuous metal pattern may be still larger than that of the metal layer before annealing.

The (regular or irregular) pattern of the metal layer may be influenced by the thickness of the metal layer, the morphological feature of the porous region, and the like, but may be more influenced by the thickness of the metal layer. For example, in the case in which the thickness of the metal layer is comparatively larger, the metal layer has a pattern of the island where the dots are connected to each other, while in the case in which the thickness of the metal layer is comparatively smaller (i.e., less than 10 nm), the island-shaped pattern gradually decreases and the dot shape will increase during high-temperature processing.

In the specification, "the regrowth layer of the first conductive semiconductor is formed on the metal layer" is described for convenience, but the expression is appreciated as a concept that means that the bottom of a partial region of the regrowth layer may not directly contact the metal layer depending on the discontinuous pattern of the metal layer by the annealing.

Since the porous region 104 of the first conductive semiconductor layer 102 on which the discontinuous metal layer pattern is distributed still has a characteristic as a porous template during the regrowth of the first conductive semiconductor, lateral growth is more remarkable than vertical growth. The present invention is not limited to a predetermined theory, but the dislocations which exist on the thin film also influences the follow-up regrowth to cause the dislocations on the regrowth layer, while in the case in which a step such as porosity exists, the growth speed on the top is different from the growth speed on the bottom (similar to the principle of ELOG) to prevent the dislocations from being generated on the regrowth layer. Accordingly, the defect may effectively be reduced on the regrowth layer 106.

In the case of the method not involving the annealing during the regrowth (i.e., MBE, and the like), additional annealing (heat treatment) may be performed before the regrowth and in this case, an annealing condition may include, for example, a temperature in the range of approximately 600 to 900° C. and approximately 1 to 5 minutes.

The first conductive semiconductor layer 106 which is regrown is regrown while filling the space or pore between the rods. The first conductive semiconductor layer 106 will preferably have at least a thickness enough to cover the porous region 104.

According to the exemplary embodiment of the present invention, the regrowth layer 106 of the first conductive semiconductor has a thickness suitable to achieve a surface plasma resonance effect between the active layer to be subsequently formed on the regrowth layer 106 and the metal layer positioned on the bottom. The thickness or height (a distance from the top of the metal pattern to the top of the regrowth layer in the porous region) of the regrowth layer 106 of the first conductive semiconductor to achieve the surface plasma resonance effect may be in the range of approximately 1 to 300 nm, more preferably, in the range of approximately 30 to 80 nm. However, it is preferable to adjust the thickness of the regrowth layer 106 of the first conductive semiconductor by considering the type of metal. For example, in the case in which a material of the metal is Ag, the thickness of the regrowth layer 106 may be in the range of approximately 42 to 50 nm (typically, approximately 47 nm), in the case in which the material of the metal is Al, the thickness of the regrowth layer 106 may be in the range of approximately 70 to 80 nm (typically, approximately 77 nm), and in the case in which the material of the metal is Au, the thickness of the regrowth layer 106 may be in the range of approximately 30 to 35 nm (typically, approximately 33 nm).

Meanwhile, in the case in which the regrowth layer 106 is processed at very high temperature from the initial stage during the regrowth, the metal layer of the bottom may be evaporated. By considering this point, according to the exemplary embodiment of the present invention, the temperature may be adjusted to comparatively low temperature in the range of approximately 600 to 850° C. during the initial regrowth (i.e., up to a thickness of approximately 1 to 30 nm) and thereafter, regrowth may be made at temperature in the range of approximately 800 to 1080° C.

After the above-mentioned regrowth is performed, as shown in FIG. 2E, the active layer 107 is formed on the regrowth layer 106 of the first conductive semiconductor. According to the exemplary embodiment of the present invention, the active layer may be formed by particularly, an InGaN layer or an AlGaN layer and have any one of multi-quantum well (MQW) and single-quantum well structures.

The above-mentioned active layer structure is merely described as an example and the present invention is not limited to a predetermined active layer structure. More preferably, the active layer may have a multi-quantum well structure of GaN/InGaN/GaN or a multi-quantum well structure of GaN/AlGaN/GaN. According to the exemplary embodiment of the present invention, the active layer 107 may have a thickness in the range of approximately 2 to 4 nm in the case of the single-quantum well structure and a thickness in the range of approximately 40 to 80 nm in the case of the multi-quantum well structure (i.e., five pairs of active layers) by using the above-mentioned layer forming method. The range of values is exemplary and the present invention is not necessary limited thereto.

Resonance is generated between surface plasmons of the active layer 107, particularly, the quantum well and the discontinuously patterned metal layer 105 formed on the bottom of the regrowth layer 106 of the first conductive semiconductor.

According to the exemplary embodiment of the present invention, as shown in FIG. 2F, a second conductive semiconductor layer 108 is formed on the active layer 107 to provide p-n hetero junction to an LED structure. The thickness of the second conductive semiconductor layer 108 may be preferably in the range of approximately 50 to 900 nm, more preferably, in the range of approximately 80 to 300 nm. Therefore, the thickness range of the second conductive semiconductor corresponds to a technical difference from the known surface plasmon LED.

In the known plural related arts, since the metal layer is disposed on the top of the LED structure, the thickness of the p-type semiconductor layer positioned between the active layer and the metal layer should be limited to a low level (i.e., less than 50 nm) in order to generate the surface Plasmon resonance. In the end, the electrical characteristic of the semiconductor layer cannot but be reduced. On the contrary, in the case of adopting the configuration according to the exemplary embodiment of the present invention, it is possible to configure the second conductive semiconductor layer 108 to have a desired electrical characteristic as well as achieve the surface plasmon resonance effect.

Further, since the regrowth layer 106 shows a good layer characteristic having the reduced defects (threading dislocations, and the like), the active layer 107 and the second conductive semiconductor layer 108 that are formed thereon also have remarkably reduced defects. As a result, it is possible to improve the internal quantum efficiency in addition to the surface plasmon effect. Furthermore, the surface roughness of the nano structure by porosity is expected to contribute to the improvement of the optical extraction efficiency. Moreover, when metal such as gold, silver, aluminum, or the like having its unique reflection characteristic is disposed on the bottom of the active layer, it is possible to acquire the additional improvement of light emission efficiency by reflecting light emitted downwardly from the active layer to the top by using the metal layer.

Meanwhile, after the second conductive semiconductor layer 108 is formed, diversified types of LED structures may be formed.

Figure 4:
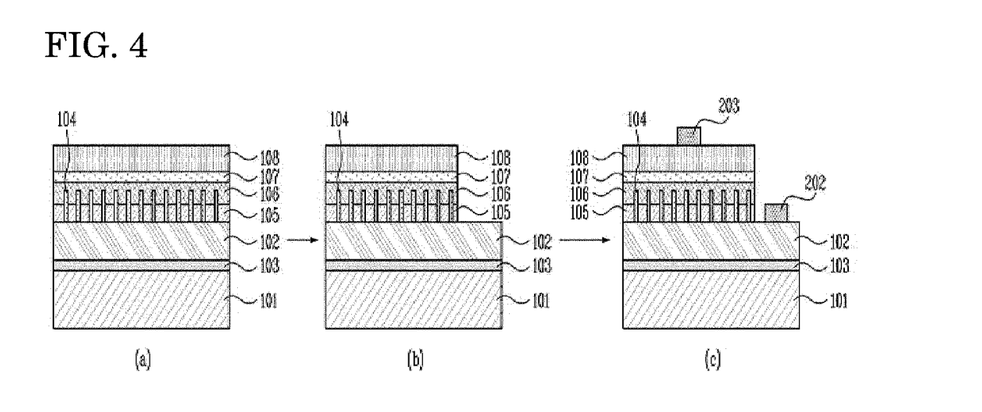
FIG. 4 is a diagram schematically showing a process of forming an electrode after forming a second conductive semiconductor layer according to an exemplary embodiment of the present invention.

FIG. 4 is a diagram schematically showing a process of forming an electrode after forming a second conductive semiconductor layer according to an exemplary embodiment of the present invention.

According to the exemplary embodiment of the present invention, as shown in FIG. 4B, the second conductive semiconductor layer 108, the active layer 107, the regrowth layer 106 of the first conductive semiconductor, the metal layer 105, and a partial portion of the porous region 104 of the first conductive semiconductor layer 102 are sequentially etched. In some cases, a residual layer of the first conductive semiconductor layer which is not PEC-etched (that is, other than the porous region) may further be etched up to a predetermined thickness. Next, a first electrode 202 is installed on the etched surface (the surface of the first conductive semiconductor layer) and a second electrode 203 is installed on the top of the second conductive semiconductor layer 108 (see FIG. 4C). In this case, in the case in which the first conductive semiconductor is n type and the second conductive semiconductor is a p type, the first electrode and the second electrode corresponds to an n-type electrode and a p-type electrode.

Figure 5:
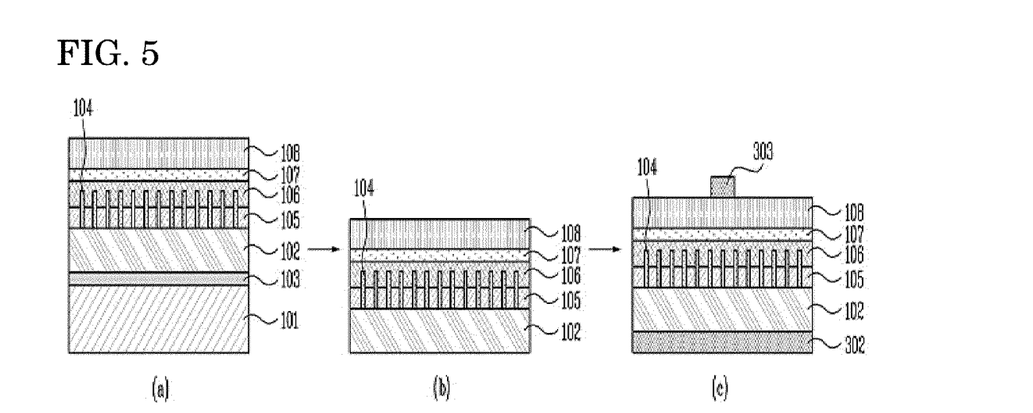
FIG. 5 is a diagram schematically showing a process of forming an electrode after forming a second conductive semiconductor layer according to another exemplary embodiment of the present invention.

FIG. 5 is a diagram schematically showing a process of forming an electrode after forming a second conductive semiconductor layer according to another exemplary embodiment of the present invention.

According to the exemplary embodiment shown above, as shown in FIG. 5B, first, a substrate 101 and a shock absorbing layer 103 are removed. Next, a first electrode 302 is attached onto the bottom of a first conductive semiconductor layer removed with the substrate, and the like and a second electrode 302 is attached onto the top of the second conductive semiconductor layer 108 (see FIG. 5C). For this, a laser lift-off or chemical lift-off method may be used.

The laser lift-off process is the method of separating the substrate and an LED structure from each other by irradiating (alternately, scanning) a high-energy ultraviolet wavelength such as an eximer laser (KrF, ArF, and the like) from the substrate. For example, in the case in which GaN is used as the conductive semiconductor, laser is absorbed and sublimation occurs by the conversion reaction of GaN to $Ga+1/2N_2$ in the lower part of the conductive semiconductor layer, while since the substrate passes through the laser, the separation of the substrate is induced.

Meanwhile, an example of the chemical lift-off process may include a method of separating the lower part of the first conductive semiconductor and the substrate 101 from each other by immersing a sample in a solution such as oxalic acid, or the like and applying voltage in the range of approximately 20 to 80V between the sample and an opposite electrode. Another example of the chemical lift-off process includes a method of introducing a material such as ZnO or CrN on the substrate during the above-mentioned LED wafer fabrication to the template. Sine the material such as ZnO or CrN is easily wet etched, the substrate 101 may be separated through wet etching.

According to the exemplary embodiment of the present invention, a current diffusion layer may selectively be introduced before forming the electrodes 203 and 303 on the second conductive semiconductor layer 108.

First Exemplary Embodiment

Fabrication of Wafer Sample

A sapphire substrate having a thickness of approximately 400 μm is preprocessed (heat-treated) with hydrogen gas at 1000° C. in an MOCVD (fabricated by VEECO, Model No. D-180) chamber and thereafter, a low-temperature GaN buffer layer is formed at 540° C. (thickness: approximately 30 nm). Subsequently, a wafer sample having a diameter of 2 inches is fabricated by growing an n-type GaN layer having a thickness of 2 μm at 1050° C.

PEC Etching

Etching Process (1)

The wafer sample is taken out from the chamber and thereafter, PET-etched by the PEC device (self-manufactured) shown in FIG. 3. The PEC etching process is performed in accordance with a process condition shown in Table 1 below.

TABLE 1

| PEC etching parameters | Conditions |
| --- | --- |
| Electrolyte | KOH (0.02M) |
| Applied voltage | 2 V |
| Etching time | 30 minutes |
| Intensity of ultraviolet rays | 350 mW |

Figure 6:
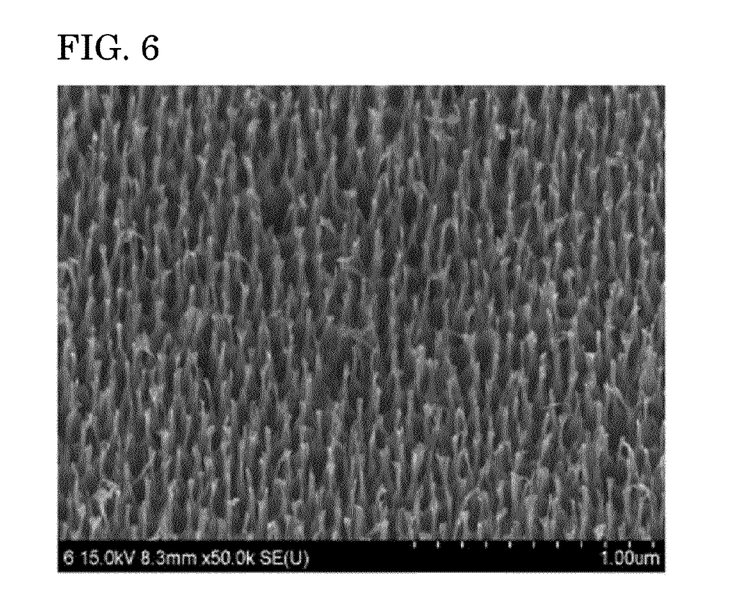
FIG. 6 is a photograph of a scanning electron microscope (SEM) showing porosity including nano rods on the surface of an n-type GaN layer of a wafer sample by PEC etching in accordance with an etching process (1) of a first exemplary embodiment.

FIG. 6 is a photograph of a scanning electron microscope (SEM) showing porosity including nano rods on the surface of an n-type GaN layer of a wafer sample by PEC etching. As shown in the figure, a porous region including a plurality of nano rods is formed on the surface of the n-type GaN layer of the wafer sample.

Etching Process (2)

As shown in Table 2 below, PEC etching is performed by the same method as the etching process (1) except for the change in the process conditions.

TABLE 2

| PEC etching parameters | Conditions |
| --- | --- |
| Electrolyte | KOH (0.04M) |
| Applied voltage | 2 V |
| Etching time | 30 minutes |
| Intensity of ultraviolet rays | 350 mW |

Figure 7A:
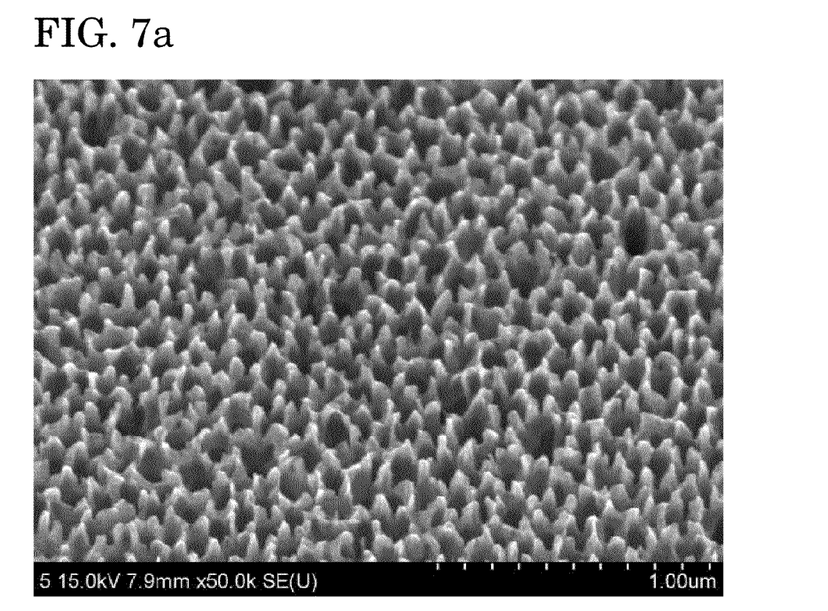
FIGS. 7A to 7C are photographs of the SEM sequentially showing the change of the surface of the n-type GaN layer depending on the time during PEC etching in accordance with an etching process (2) of the first exemplary embodiment.
Figure 7B:
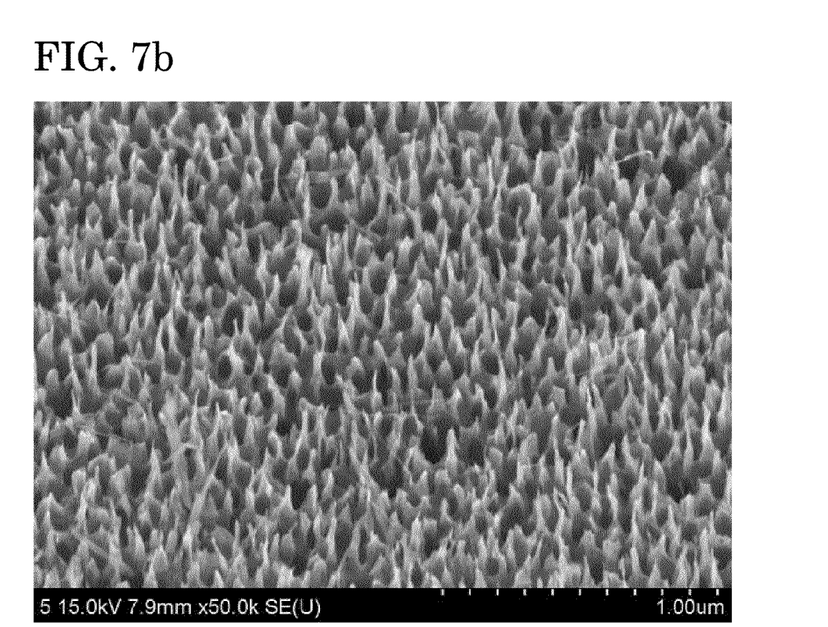
Figure 7C:
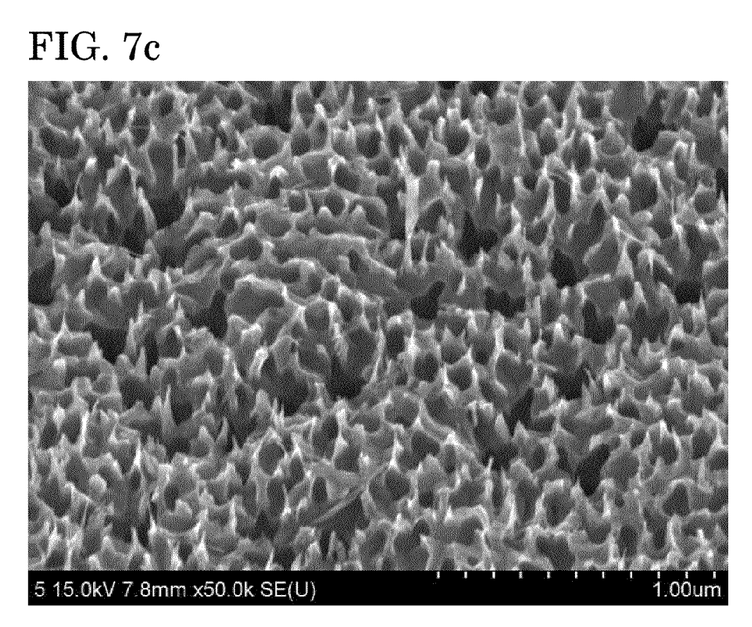

FIGS. 7A to 7C are photographs of the SEM sequentially showing the change of the surface of the n-type GaN layer depending on the time during etching. As shown in the figure, the surface of the n-type GaN layer is partially etched by PEC etching (see FIG. 7A) and gradually shows the shape of the nano rod (see FIG. 7B). As the etching is consistently performed, the thickness (width) of the nano rod is reduced. In the end, the rod shape is lost as shown in FIG. 7C. That is, etching speed is increased by increasing the concentration of the electrolyte Formation of Metal Layer Silver (Ag) is deposited on the PEC-etched wafer sample with a thickness of 10 nm by using an e-beam depositor (manufactured by Korea Vacuum Tech, Model No. KVE-C25096) in accordance with the etching process (1). In this case, the height of the nano rod is approximately 200 nm.

Regrowth of N-Type GaN

The sample with the metal layer (Ag) is again put into the MOCVD chamber and regrown. In this case, the regrowth process is performed to form a thickness of approximately 15 nm at 800° C. and approximately 35 nm at 1050° C. and is annealed at 800° C. for 3 minutes before regrowth.

Figure 8:
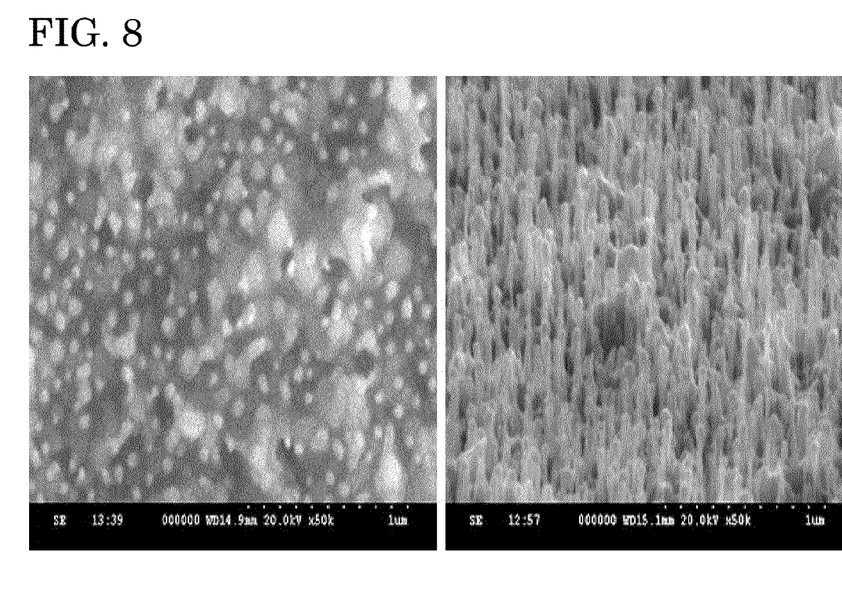
FIG. 8 is a photograph of the SEM showing the state of the surface of the sample by annealing accompanied during regrowth of the LED fabricating process according to the first exemplary embodiment.

The change of the surface of the sample by annealing accompanied in the MOCVD chamber is observed by using the SEM and the observation result is shown in FIG. 8. As shown in a left photograph of FIG. 8, a comparatively bright part between the rods corresponds to metal and exists as a kind of island pattern. Further, as shown in a right photograph of FIG. 8, a metal (Ag) dot is formed on the nano rod. In this case, the metal pattern has a height of approximately 150 nm as a cluster by annealing.

In accordance with the above-mentioned process, the n-type GaN fills spaces between the nano rods (that is, laterally grown while merging) and thereafter, is regrown in a c-axis to be formed in a layer having a height of 50 nm (the distance from the top of the metal pattern clustered by annealing to the top of the regrowth layer).

Figure 9:
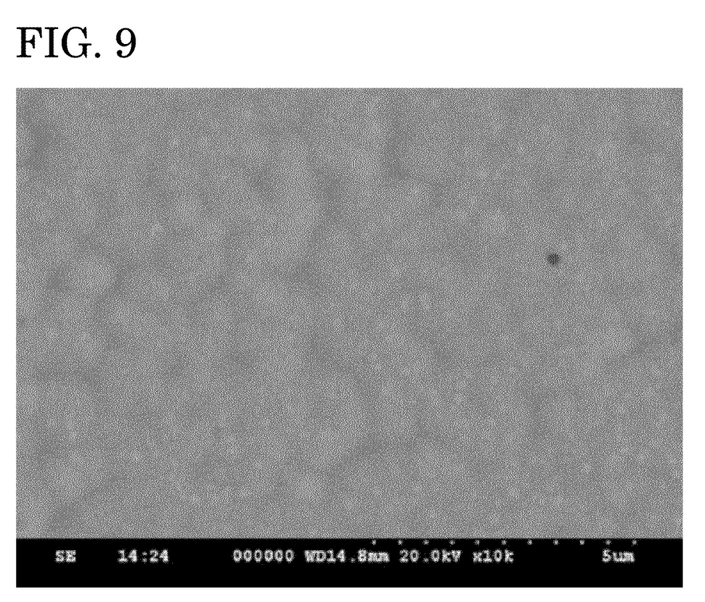
FIG. 9 is a photograph showing a result of observing the state of the surface of the sample which is subjected to the regrowth of the LED fabricating process by using an electronic microscope according to the first exemplary embodiment.

A result of observing the surface of the regrown sample by using an electronic microscope is shown in FIG. 9. As shown in the figure, the sample which is deposited with metal (Ag) and regrown has a smooth surface because metal already fills the spaces between the nano rods and GaN is rapidly merged while being regrown on the metal.

Formation of Active Layer and P-Type GaN Layer

Figure 10:
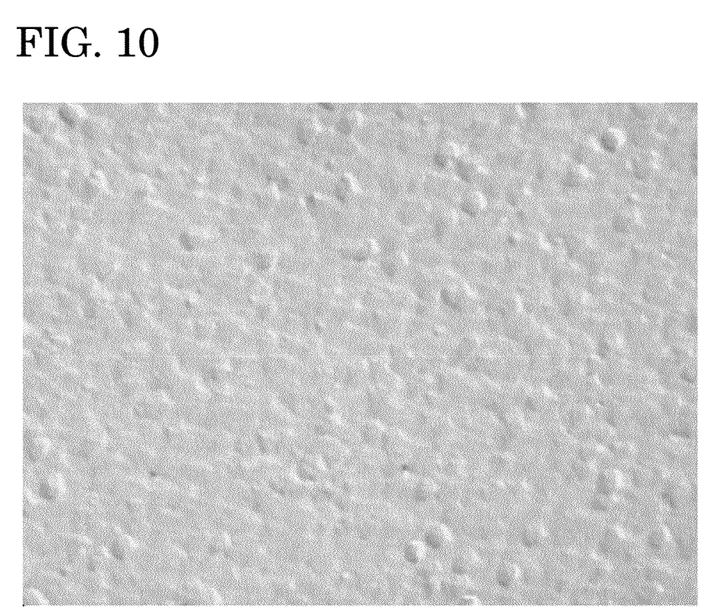
FIG. 10 is a photograph showing a result of observing the surface state of the LED fabricated according to the first exemplary embodiment by using an optical microscope (magnification: ×100)

An InGaN well having a thickness of approximately 3 nm and a multi-quantum well layer (active layer) constituted by five pairs of GaN barriers having a thickness of approximately 7 nm are formed on the regrowth layer of the n-type GaN in the MOCVD chamber at 780° C. and 830° C., respectively and subsequently, a p-type GaN layer having a thickness of 150 nm is formed on the multi-quantum well layer at 990° C. to fabricate an LED wafer. A result of observing the surface state of the LED wafer fabricated as described above by using an optical microscope (magnification: ×100) is shown in FIG. 10. As shown in the figure, the LED wafer has the smooth surface.

Fabrication of LED

The LED wafer is partially etched by ICP-etching until the n-type GaN layer is exposed. Next, a Cr/Au (20 nm/100 nm) electrode layer is formed on each of the p-type GaN layer on the top of the LED wafer by using the e-beam depositor (manufactured by Korea Vacuum Tech, Model No. KVE-C25096) and the n-type GaN layer exposed by partial etching.

Comparative Example

Figure 11:
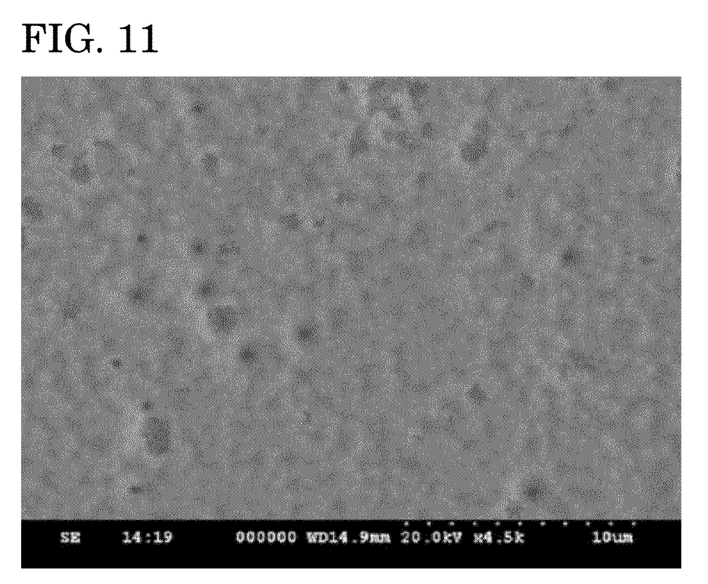
FIG. 11 is a photograph showing a result of observing the state of the surface of a sample which is subjected to regrowth of an LED fabricating process by using an electronic microscope according to a comparative example.

The LED is fabricated by the same method as the exemplary embodiment except for performing the regrowth without forming the metal layer. A result of observing the surface of the regrowth layer by using the electronic microscope before forming the multi-quantum well layer is shown in FIG. 11. As compared with FIG. 9, the regrowth layer is a comparatively rough surface in the case in which the metal layer is not formed. The reason is that since a time required for the regrowth which occurs from the spaces between the nano rods is not enough, merging is not sufficient.

Second Exemplary Embodiment

Electroluminescence (EL) Evaluation

Figure 12:
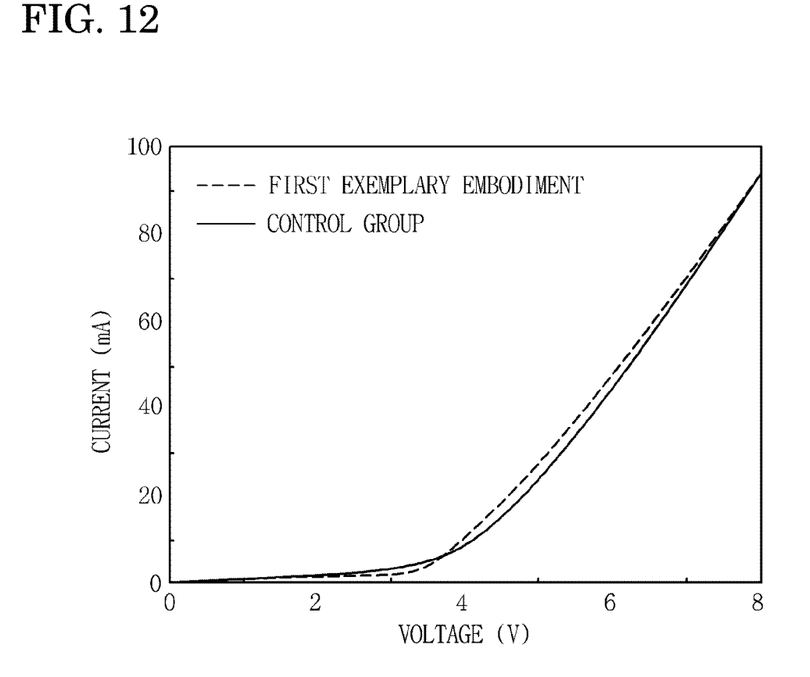
FIG. 12 is an I-V curve showing an electrical characteristic at the time of evaluating EL of each of the LED of the first exemplary embodiment and an LED of a control group according to a second exemplary embodiment.

Electrical characteristics are measured at the time of evaluating EL of each of the LED fabricated in accordance with the first exemplary embodiment and a control group (an LED fabricated in the same method as the first exemplary embodiment except PEC etching and the metal layer forming process are performed) and the measurement results are displayed by an I-V curve shown in FIG. 12. As shown in the figure, in the case of the EL measurement, the LED according to the first exemplary embodiment has a forward voltage of 4.4V, while the control group has a forward voltage of 4.6. Therefore, they are substantially similar to each other. As a result, the existence of the metal layer has no particular influence on the electrical characteristics.

Figure 13:
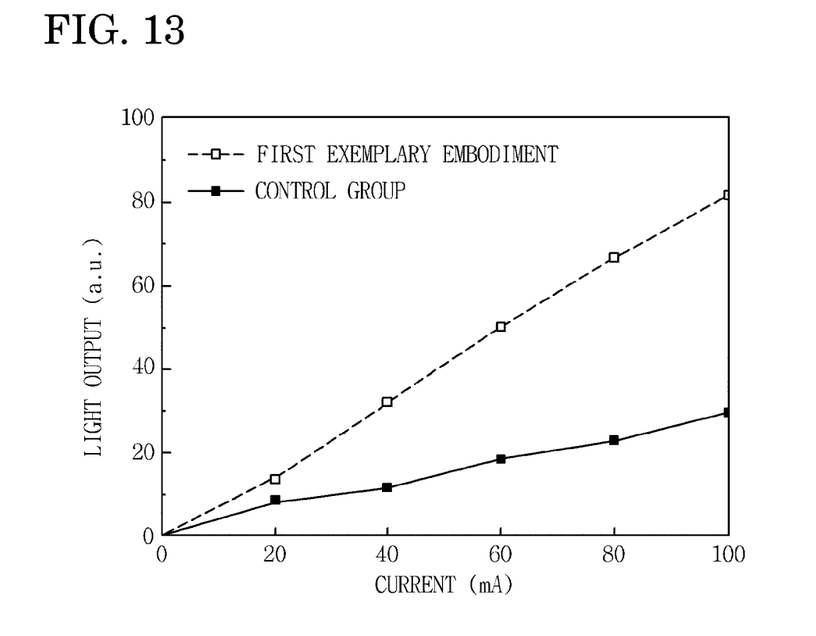
FIG. 13 is an L-I curve showing an EL characteristic of each of the LED of the first exemplary embodiment and an LED of a control group according to a second exemplary embodiment.

Meanwhile, the EL characteristics of the LED fabricated according to the first exemplary embodiment and the control group is evaluated and the evaluation results are shown by an L-I curve shown in FIG. 13. As shown in the figure, the LED of the exemplary embodiment shows a light output approximately 1.6 times higher than the LED of the control group under 20 mA and as the current increases, the difference further increases. In the first exemplary embodiment, since the metal layer exists adjacent to the active layer (multi-quantum well layer), light emission efficiency is increased by energy coupling.

Photoluminescence (PL) Evaluation

Figure 14:
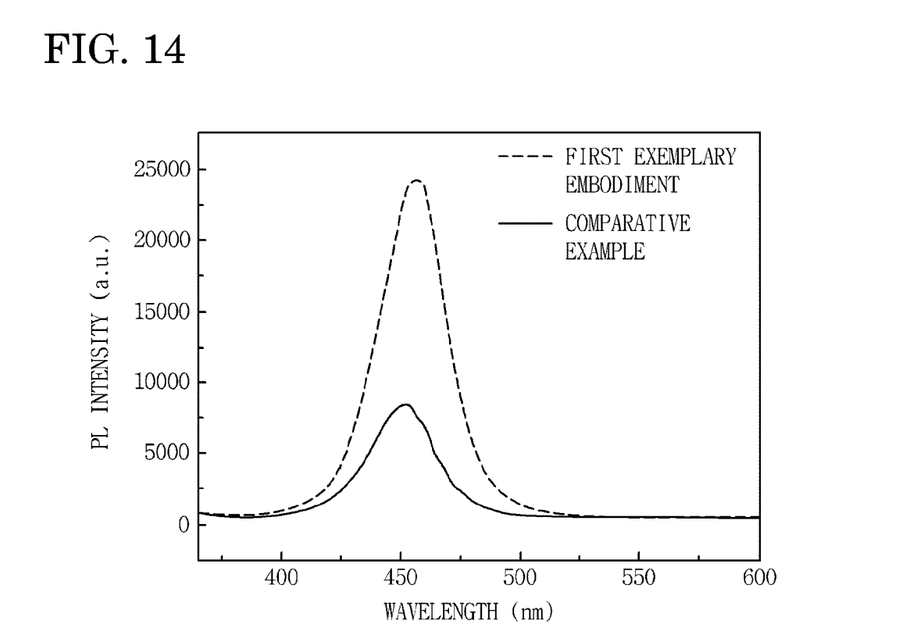
FIG. 14 is a PL spectrum for each of the LED of the first exemplary embodiment and an LED of a comparative example according to a second exemplary embodiment.

The LED and a PL spectrum of the LED fabricated according to each of the first exemplary embodiment and the comparative example, respectively are shown in FIG. 14. As shown in the figure, PL intensity in the first exemplary embodiment is approximately 2.67 times higher than that in the comparative example. Further, the comparative example shows an emission wavelength slightly shorter than the exemplary embodiment because as the multi-quantum well layer is grown while incomplete merging is made when the metal layer is PEC-etched and regrown, the light emission efficiency of the active layer is low and the LED shows a different emission pattern.

Third Exemplary Embodiment

In order to verify whether or not the defects are reduced in the LED according to the exemplary embodiment of the present invention, the density of the defect (threading dislocations) of each of the LED fabricated in accordance with the first exemplary embodiment and a control group (an LED fabricated by the same method as the first exemplary embodiment except PEC etching and the metal layer forming process are performed) is measured.

Each of the LED samples is wet-etched in molten KOH at 350° C. for 5 minutes. In this case, the defect portions are etched during wet etching and the number of defects per unit area is counted and calculated.

Figure 15A:
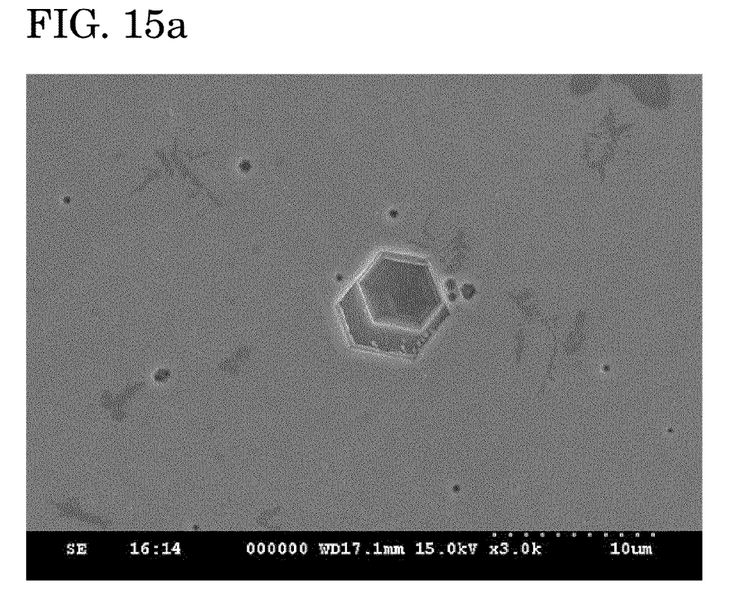
FIGS. 15A and 15B are photographs of an SEM showing the surface state during measuring defect density of each of the LED of the first exemplary embodiment and the LED of the control group according to a third exemplary embodiment.
Figure 15B:
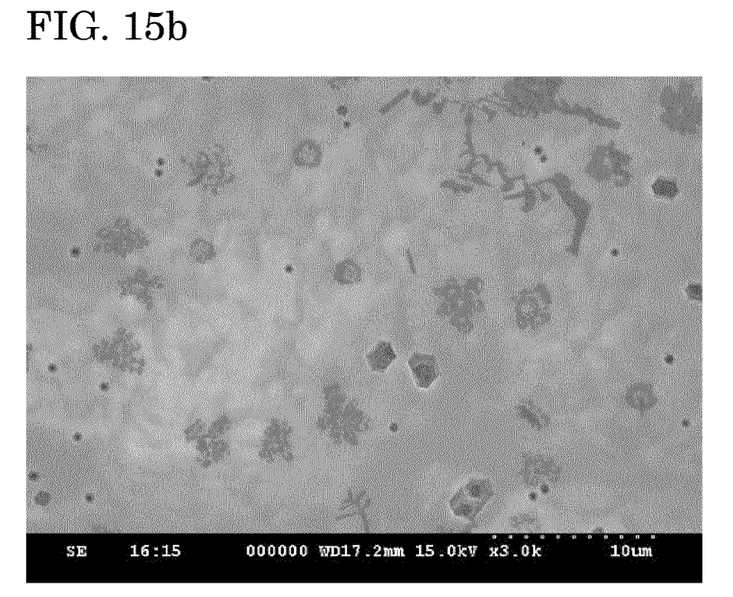

The surfaces of the first exemplary embodiment and the control group in accordance with the experiment are shown in FIGS. 15A and 15B, respectively. On the basis of the measurement result, the defect density of the first exemplary embodiment is approximately $5.2 \times 10^5/cm^2$, while the defect density of the control group is approximately $2.68 \times 10^6/cm^2$. Accordingly, the defect density of the LED fabricated according to the exemplary embodiment of the present invention is remarkably reduced.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Accordingly, the actual technical protection scope of the present invention must be determined by the spirit of the appended claims.

What is claimed is:

1. A method for fabricating a light emitting diode, comprising:
   a) providing a first conductive semiconductor layer onto a substrate;
   b) forming a porous region by dry or wet etching the top of the first conductive semiconductor layer;
   c) forming a metal layer on the first conductive semiconductor layer where the porous region is formed;

d) regrowing the first conductive semiconductor layer on the metal layer;

e) forming an active layer on the regrown first conductive semiconductor layer; and f) forming a second conductive semiconductor layer on the active layer, wherein at step d), the first conductive semiconductor layer is regrown while the metal layer is discontinuously patterned in the porous region by annealing and the regrown first conductive semiconductor layer has a thickness to generate surface plasma resonance between the patterned metal layer and the active layer.

2. The method of claim 1, wherein the porous region is formed by PEC etching which is wet etching.

3. The method of claim 1, wherein the thickness of the porous region is in the range of 50 to 300 nm.

4. The method of claim 1, wherein the porous region includes a plurality of nano rods and the widths of the nano nodes are in the range of 10 to 40 nm and the heights of the nano nodes are in the range of 50 to 300 nm.

5. The method of claim 1, wherein the thickness of the metal layer formed at step c) is in the range of 5 to 250 nm.

6. The method of claim 1, wherein the discontinuous pattern of the metal layer is formed by annealing and the annealing is performed before step d) or during step d).

7. The method of claim 1, wherein step d) is performed by a metal organic chemical vapor deposition (MOCVD) method.

8. The method of claim 1, wherein discontinuous pattern of the metal layer is discontinuously distributed dots, an island where the dots are connected to each other, or a pattern where they coexist.

9. The method of claim 1, wherein the thickness of the regrown first conductive semiconductor layer is in the range of 1 to 300 nm.

10. The method of claim 1, wherein the thickness of the second conductive semiconductor layer is in the range of 80 to 300 nm.

* * * * *